United States Patent
Gurusami et al.

(10) Patent No.: US 7,512,162 B2
(45) Date of Patent: Mar. 31, 2009

(54) DYNAMIC THERMAL MANAGEMENT OF LASER DEVICES

(75) Inventors: Aravanan Gurusami, Painted Post, NY (US); Timothy K. Zahnley, Spencer, NY (US); Scott R. Dahl, Corning, NY (US); Gregory Chilson, Houston, TX (US)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 11/747,728

(22) Filed: May 11, 2007

(65) Prior Publication Data

US 2008/0279237 A1 Nov. 13, 2008

(51) Int. Cl.
*H01S 3/04* (2006.01)
(52) U.S. Cl. .................. 372/34; 372/33; 372/29.015
(58) Field of Classification Search .................. 372/34, 372/33
See application file for complete search history.

(56) References Cited

U.S. PATENT DOCUMENTS

| 5,019,769 | A | * | 5/1991 | Levinson | 372/31 |
| 5,918,469 | A | * | 7/1999 | Cardella | 62/3.7 |
| 2008/0047278 | A1 | * | 2/2008 | Saad et al. | 62/3.7 |

* cited by examiner

*Primary Examiner*—Dung T Nguyen
(74) *Attorney, Agent, or Firm*—Patterson & Sheridan L.L.P.

(57) ABSTRACT

The present invention generally relates to dynamic thermal management of a device. In one aspect, a method for thermally controlling a device is provided. The method includes setting a value of a set point in a thermoelectric cooler, wherein the set point corresponds to a first operating state. The method also includes monitoring a condition of the device to determine if the device is in the first operating state or a second operating state. Additionally, the method includes dynamically altering the value of the set point according to an algorithm upon determination that the device is in the second operating state. In another aspect, a method for dynamically controlling a device having a thermoelectric cooler is provided. In yet a further aspect, a system for dynamic thermal management of a device is provided.

17 Claims, 5 Drawing Sheets

DYNAMIC THERMAL MANAGEMENT OF LASER DEVICES

BACKGROUND OF THE INVENTION

1. Field of the Invention

Embodiments of the present invention generally relate to telecommunication equipment. More particularly, embodiments of the present invention relate to dynamic thermal management of laser devices.

2. Description of the Related Art

Thermoelectric cooling (TEC) devices are commonly used in the medical industry, the recreation (i.e. camping) industry, the transportation industry, and the telecommunication industry, to name a few. TEC devices use the Peltier effect to create a heat flux between the junction of two different types of materials. More specifically, TEC devices transfer heat from one side of the device to the other side of the device (from hot to cold), with the consumption of electrical energy. The effectiveness of the TEC device at moving heat is dependent upon the amount of current provided.

In the telecommunication industry, a TEC device is typically used to maintain a constant temperature, such as 25 C, of a telecommunication component or equipment. The TEC device is configured to maintain the constant temperature by utilizing a fixed set point which relates to the telecommunication component or equipment. For instance, if the telecommunication component is a pump laser, then the TEC set point is fixed in relation to the temperature where the pump laser is reliable.

Although TEC devices are an effective means to maintain a constant temperature in the component, a problem arises when the operating conditions in a controlled environment, such as a Central Office (CO), deteriorate due to failure of cooling equipment, such as fans or air-conditioners. The ambient temperature can be much higher than normal operating conditions and the TEC device is required to work harder to maintain the constant temperature (i.e. fixed set point). As previously noted, the current consumption of TEC is proportional to the temperature difference between the TEC set point and the ambient. With a higher ambient temperature, this leads to higher power having to be dissipated into the CO environment, which subsequently may lead to a "thermal runaway" condition. As a consequence, the system that includes the component usually must be shut down in order to protect the system from further damage, which results in an increase in operational expense.

There is a need, therefore, for an effective method and system for dynamic thermal management of a device. There is a further need, therefore, for an effective method for dynamically controlling a TEC set point in order to minimize damage to a system.

SUMMARY OF THE INVENTION

The present invention generally relates to dynamic thermal management of a device. In one aspect, a method for thermally controlling a device is provided. The method includes setting a value of a set point in a thermoelectric cooler, wherein the set point corresponds to a first operating state. The method also includes monitoring a condition of the device to determine if the device is in the first operating state or a second operating state. Additionally, the method includes dynamically altering the value of the set point according to an algorithm upon determination that the device is in the second operating state.

In another aspect, a method for dynamically controlling a device having a thermoelectric cooler is provided. The method includes monitoring a condition in the device to determine if the device is in a first operating state or a second operating state. The method further includes dynamically adjusting a value of a set point of the thermoelectric cooler according to an algorithm if the device is in the second operating state. Furthermore, the method includes determining whether the device has returned to the first operating state by analyzing the condition.

In yet a further aspect, a system for dynamic thermal management of a device is provided. The system includes a thermoelectric cooler disposed adjacent the device, wherein the thermoelectric cooler has a set point with a value and the set point corresponds to a first operating state. The system also includes at least one sensor configured to generate data regarding a condition in the thermoelectric cooler. Additionally, the system includes a system controller configured to receive the data and dynamically adjust the value of the set point according to an algorithm upon determination of a second operating state.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to dynamic thermal management of devices. The invention will be described in relation to a laser device. It must be noted, however, that aspects of the present invention are not limited to laser devices, but are applicable to other types of devices that require thermal management, such as computing devices, motors, outdoor equipment, hybrid equipment, etc. Further, various modifications to the preferred embodiments will be readily apparent to those skilled in the art and the generic principles described herein may be applied to other embodiments. Thus, the present invention is not intended to be limited to the embodiments shown, but is to be accorded the widest scope consistent with the principles and features described herein. In order to gain a detailed understanding of the invention, the reader is referred to the appended Figures in conjunction with the following description. It is to be understood that the drawings are diagrammatic and schematic representations only and are neither limiting of the scope of the present invention nor necessarily drawn to scale.

Figure 1:
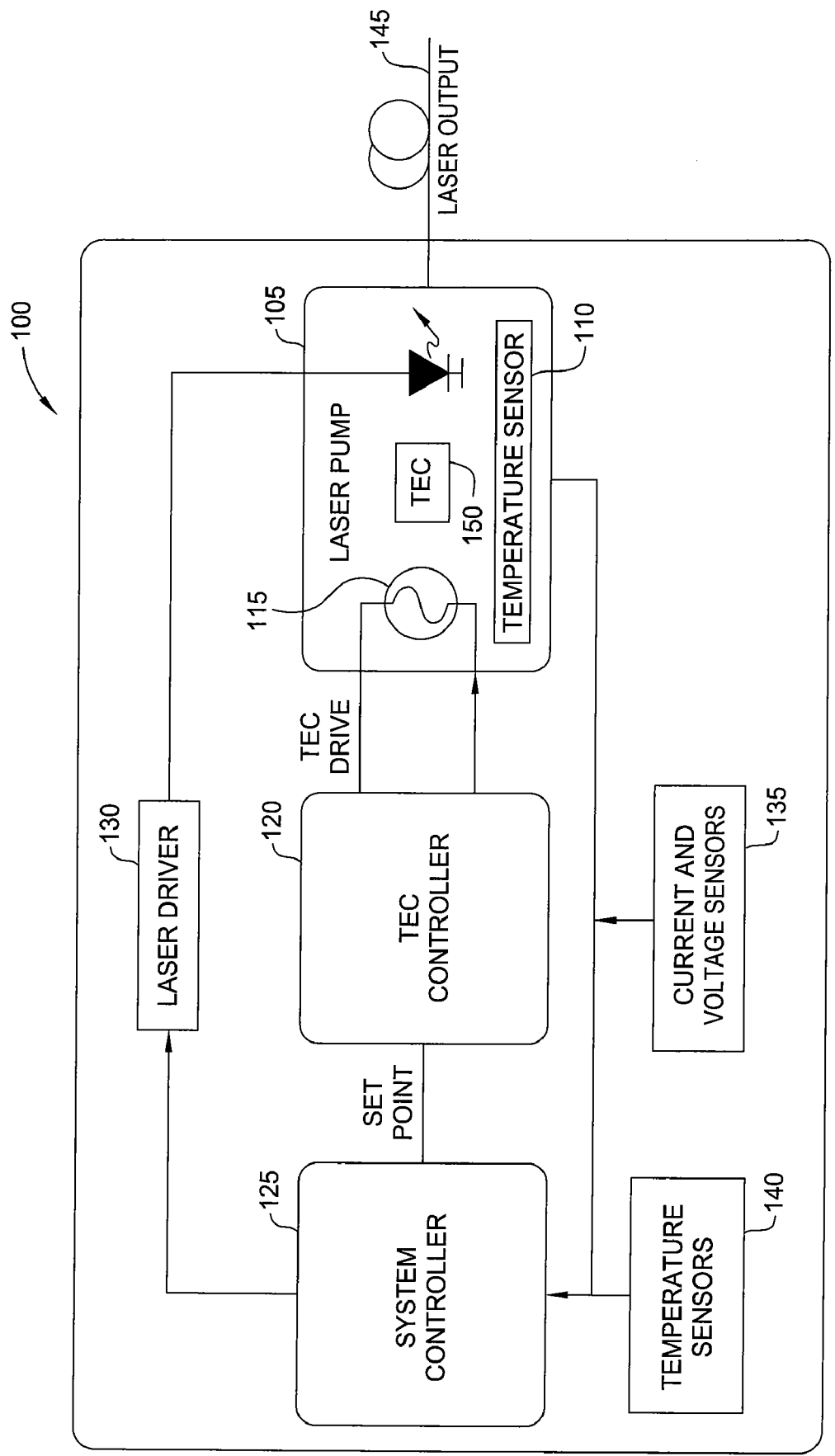
FIG. 1 illustrates a system for dynamic thermal management of a laser device, according to one embodiment of the invention.

FIG. 1 illustrates a system 100 for dynamic thermal management of a laser device, according to one embodiment of the invention. As shown, the system 100 includes a thermoelectric cooler (TEC) 150 used to control the temperature of a laser pump 105. Generally, the TEC 150 is configured to maintain a constant device temperature, such as 25° C., for the laser pump 105. In operation, the TEC 150 transfers heat from one side of the TEC 150 to the other side of the TEC 150 with consumption of electrical power. The amount of power consumed by the TEC 150 is typically proportional to the temperature difference between a TEC set point and an ambient temperature. In other words, if the temperature of the laser pump 105 increases, then the TEC 150 must consume more power to maintain the TEC set point. As will be described herein, the TEC set point may be dynamically changed depending on environmental conditions to control power consumption.

As illustrated in FIG. 1, the TEC 150 may operate in conjunction with a temperature sensor 110. The temperature sensor 110 may be positioned to sense and generate data regarding a localized temperature in the laser pump 105. The localized temperature data may be used by a system controller 125 to dynamically adjust the TEC set point for the TEC 150. The TEC 150 may be connected to a TEC controller 120 via a TEC drive 115. Generally, the TEC controller 120 controls the power supplied to the TEC 150 via the TEC drive 115 in order to maintain the TEC set point. As more power is supplied to the TEC 150 from the TEC controller 120, the larger the amount of heat is removed from the laser pump 105 to maintain the TEC set point. Conversely, reducing the power supplied to the TEC 150 from the TEC controller 120 via the TEC drive 115 results in a less amount of heat removed from the laser pump 105.

The system 100 also includes current and voltage sensors 135 for use in sensing and generating data regarding the power consumed by the TEC 150. The current and voltage data may be used by the system controller 125 along with the localized temperature data generated by the temperature sensor 110 to dynamically adjust TEC set point, if required, based upon the environmental condition. The system also includes temperature sensors 140 for use in sensing and generating data regarding the temperature of other components adjacent the laser pump 105 or in the Central Office containing them.

The system controller 125 is a programmable device that receives input data from the temperature sensors 110, 140 and the current and voltage sensors 135 and then dynamically adjusts the TEC set point based upon the data. As will be discussed herein, the system controller 125 may include an algorithm that monitors the environment in the laser pump 105 and the environment surrounding the laser pump 105 in order to maintain a specific environmental condition in the system 100. The system controller 125 may also be used to control a laser driver 130 of the laser pump 105 such that the laser pump 105 generates a laser output 145 having desired characteristics.

Figure 2:
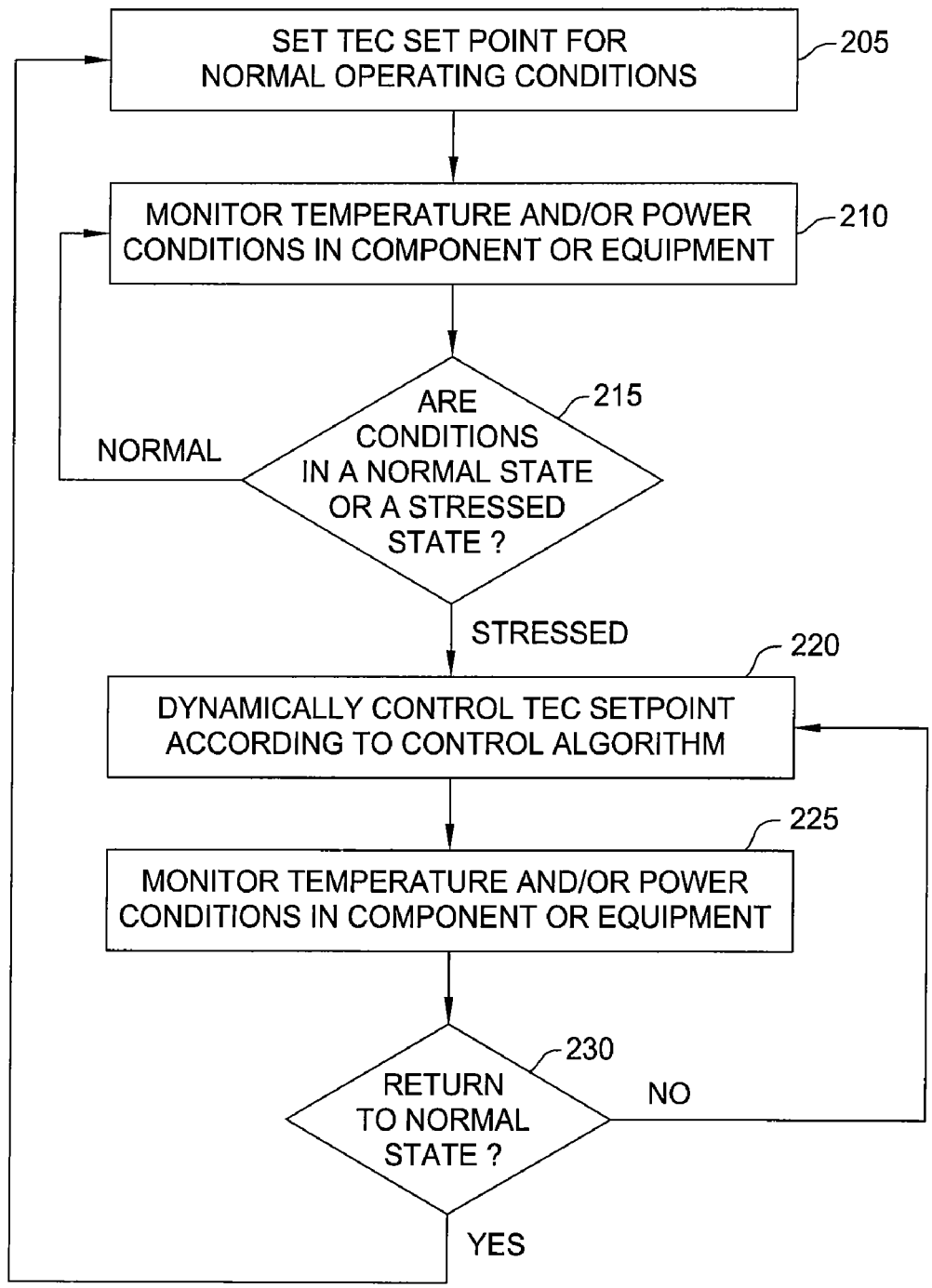
FIG. 2 is a flow chart of method steps for a control process that dynamically controls a set point of a thermoelectric cooler, according to one embodiment of the invention.

FIG. 2 is a flow chart of method steps for a control process 200 that dynamically controls the set point of the TEC 150, according to one embodiment of the invention. Although the method steps are described in the context of the system of FIG. 1, any system configured to perform the method steps, in any order, is within the scope of the invention. Generally, the control process 200 is used to dynamically change the TEC set point depending on whether the condition of the component or equipment is in a normal state or a stressed state. The normal state generally refers to a first operating state when the component or equipment is operating normally such that the ambient temperature is controlled and the power consumption is at nominal range. The stressed state, on the other hand, generally refers to a second operating state when the ambient temperature in the environment has exceeded a specific point or when the temperature in the TEC 150 has exceeded a specific point. The stressed state may also include when the power consumption of the component or equipment has reached a threshold power consumption level. Further, the stressed state may be when the temperature in the component or equipment has been at a specific level for a predetermined amount of time. In either case, the control process 200 is used to dynamically adjust the set point of the TEC 150, if required, to ensure the component or equipment is operating effectively.

The control process 200 begins in step 205, where the TEC set point is set for normal conditions (e.g. normal state). The normal conditions may be set based on the temperature in a component, the temperature of equipment adjacent the component, a power budget relating to the electric power consumed by the TEC 150, or combinations thereof.

In step 210, the temperature and/or power conditions in the component or equipment (e.g. pump laser 105 and/or TEC 150) are monitored. In this step, the sensors (e.g. sensors 110, 135, 140) may be used to monitor the temperature and/or power conditions. The sensors may be in the component or in the equipment adjacent the component.

In step 215, the monitored data from the sensors regarding the temperature and/or power conditions is analyzed to determine if the component or equipment is in the normal state or in the stressed state. In this stressed state, the monitoring step 210 may also include utilizing a timer to measure the amount of time the component or equipment has been above a threshold temperature.

If the conditions are in the normal state, then the process 200 returns to step 210 to continue monitoring the temperature and/or power conditions in the component or equipment. If the conditions are in the stressed state, then, in step 220, the TEC set point is dynamically controlled according to a control algorithm. The control algorithm may control the TEC set point in a variety of different ways. For example, the control algorithm may raise the set point to a predetermined level and then trigger an alarm. In another example, the control algorithm may maintain the current set point and then record data that may be used to dynamically adjust the set point incrementally. An example of a control algorithm for dynamically controlling the set point will be discussed in relation to FIG. 3.

In step 225, the temperature and/or power conditions in the component or equipment are once again monitored. In step 230, the monitored data from the sensors regarding the temperature and/or power conditions is analyzed to determine if the component or the equipment has returned to the normal state or continues to be in the stressed state. If the conditions have returned to the normal state, then the process 200 returns to step 205 where the TEC set point is set for normal conditions. If the conditions continue to be in the stressed state, then the process 200 returns to step 220 wherein the TEC set point is dynamically controlled according to the control algorithm.

Figure 3:
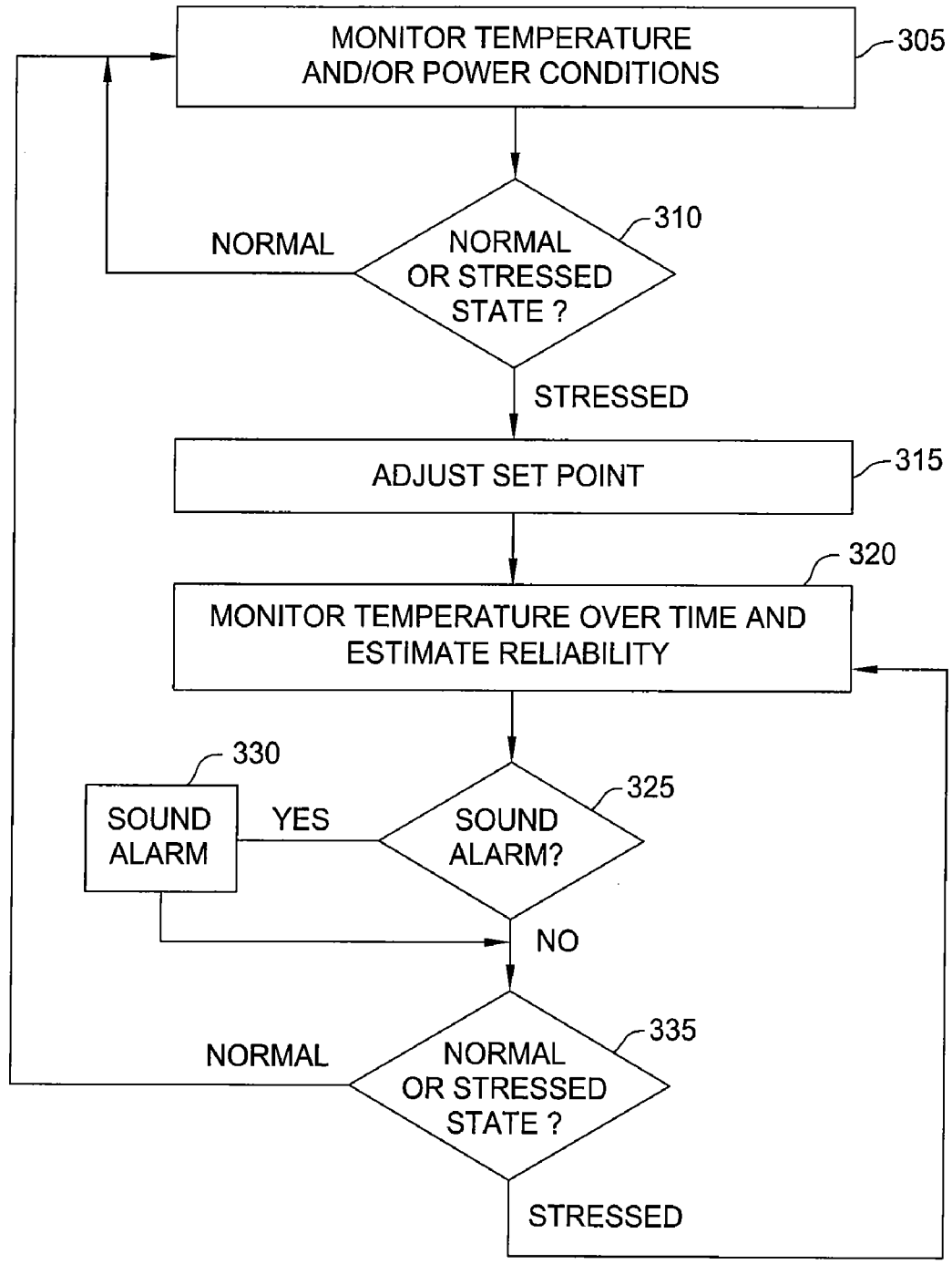
FIG. 3 is a flow chart of method steps of a control algorithm for dynamically controlling the set point, according to one embodiment of the invention.

FIG. 3 is a flow chart of method steps of a control algorithm process 300 for dynamically controlling the set point. Although the method steps are described in the context of the system of FIG. 1, any system configured to perform the method steps, in any order, is within the scope of the invention. Further, the control algorithm process 300 is merely an example of a control algorithm that may be used to dynamically change the set point of the TEC 150. It is to be understood, however, that the present invention is not limited to the control algorithm process 300 illustrated in FIG. 3, but rather a variety of different control algorithms may be used without departing from principles of the present invention.

The control algorithm process 300 begins in step 305, where the temperature and/or power conditions in the component or equipment are monitored. As previously set forth, the sensors (e.g. sensors 110, 135, 140) may be used to monitor the temperature and/or power conditions in the component or equipment. In step 310, the monitoring data from the sensors is analyzed to determine if the component or equipment is in the normal state or in the stressed state. If in the normal state, then the process 300 returns to step 305 where the temperature and/or power conditions in the component or equipment is monitored. If in the stressed state, then, in step 315, the TEC set point is adjusted.

In step 315, the TEC set point may be adjusted upward or downward relative to the current TEC set point. For example, if the power consumption in the component or equipment has reached a threshold level, then the TEC set point may be adjusted upward to allow a smaller differential between the TEC set point and the ambient temperature. In another example, if the temperature in the component has reached a specific temperature, then the TEC set point may be adjusted downward, thereby causing the TEC to adjust the temperature of the component or equipment. In a further example, if the temperature of the component has remained constant for a certain amount of time, the TEC set may be adjusted accordingly to change the temperature of the component. In any case, the TEC set point is typically adjusted according to the temperature condition or power condition that is affecting the component or equipment.

In step 320, the temperature is monitored over time and the reliability is estimated. The reliability may be estimated, for example, using a mean time between failures (MTBF) calculation. Generally, MTBF relates to the mean (i.e. average) time between failures of the component or equipment. Typically, a calculation is performed utilizing certain criteria relating to the equipment or component to determine a top-level aggregate statistic relating to the mean time between failures. The failure rate may be described in units of "FITs", or alternatively as MTBF in hours. In this step, the temperature may also be monitored over time. The temperature is an important aspect of the functionality of the component or equipment and predicting reliability. For instance, if the temperature of the component or equipment is maintained at a high level for a certain amount of time, then the equipment or component may prematurely fail or lose functionality.

Based upon the information generated in step 320, an alarm sequence is activated in step 325. Generally, the alarm sequence is a set of predetermined instructions that determine whether or not an alarm should be sounded. If the alarm sequence indicates that there should be an alarm, then, in step 330, the alarm is sounded. Next, in step 335, further analysis is conducted to determine if the component or equipment has returned to the normal state or still in the stressed state. An example of an alarm sequence will be discussed in relation to FIG. 4.

In step 335, the condition of the component or equipment is determined. More specifically, the data regarding the component or equipment is analyzed to determine if the component or equipment is in the normal state or the stressed state. If the condition of the component or equipment has returned to the normal state, then the process 300 returns to step 305 where the temperature and/or power conditions in the component or equipment are monitored. If the condition of the component or equipment remains in the stressed state, then the process 300 returns to step 320 where the temperature is monitored over time and the reliability is estimated.

Figure 4:
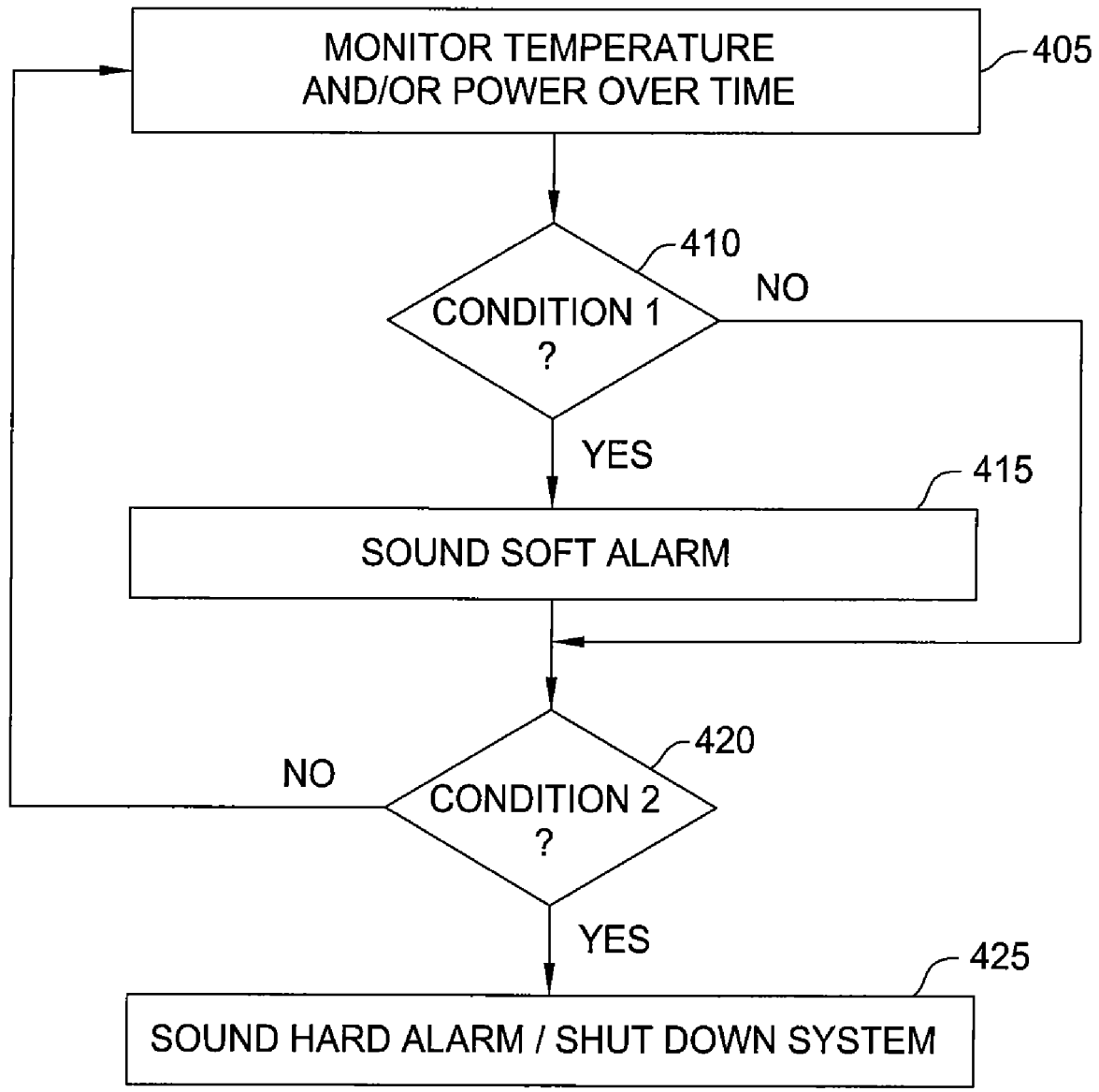
FIG. 4 is a flow chart of method steps of an alarm sequence process, according to one embodiment of the invention.

FIG. 4 is a flow chart of method steps of an alarm sequence process 400, according to one embodiment of the invention. Although the method steps are described in the context of the system of FIG. 1, any system configured to perform the method steps, in any order, is within the scope of the invention. Further, the alarm sequence process 400 is merely an example of a sequence that may be used to activate an alarm or shut down the system. It is to be understood, however, that the present invention is not limited to the alarm sequence process 400 illustrated in FIG. 4 but rather a variety of different sequences may be used without departing from principles of the present invention.

The alarm sequence process 400 begins in step 405 when the temperature and/or power conditions in the component or equipment are monitored. In step 410, the data generated in step 405 is analyzed to determine whether or not a first condition has been met. The first condition may consist of a variety of different conditions depending on the type of component or equipment. For example, the first condition may be related to the temperature of the component or equipment, wherein the current temperature is compared to a predetermined temperature that may affect the functionality of the component or equipment. In this example, the first condition is met if the current temperature has reached (or passed) the predetermined temperature. As a result, a soft alarm may be sounded in step 415. However, if the current temperature has not yet reached the predetermined temperature, then, in step 420, the data is further analyzed to determine whether or not a second condition has been met.

Referring back to step 415, the soft alarm is sounded when the first condition is met. The soft alarm is used to indicate to a person in a Central Office (CO) that the component or equipment may require some form of servicing in the near future. The soft alarm is typically used in conjunction with the control algorithm process to adaptively mange the functionality of the equipment or component. For instance, the soft alarm is sounded to inform the person in the Central Office of a potential problem with the component or equipment while essentially at the same time the control algorithm process dynamically adjusts the set point to a higher level which in turn changes the temperature of the component or equipment to an acceptable level for a predetermined amount time. In this manner, the soft alarm and the control algorithm process may be used to extend the time between the indication of the potential problem and the servicing of the component or equipment to remedy the potential problem. This time extending arrangement saves power, time, operational costs, and capital expense.

In step 420, the data generated in step 405 is further analyzed to determine whether or not the second condition has been met. The second condition may consist of a variety of different conditions depending on the type of component or equipment. For example, the second condition may be related to the power consumption of the component or equipment, wherein the current power consumption is compared to a predetermined power consumption that may affect the functionality of the component or equipment. In this example, the second condition is met if the power consumption has reached (or passed) the predetermined power consumption. As a result, a hard alarm may be sounded in step 425. However, if the power consumption has not yet reached the predetermined power consumption, then the process 400 returns back to step 405 when the temperature and/or power conditions in the component or equipment are monitored.

In step 425, the hard alarm is sounded when the first condition and the second condition are met. The hard alarm is used to indicate to the person in the Central Office that the component or equipment may require servicing shortly. The hard alarm may be used in conjunction with the control algorithm process to adaptively mange the functionality of the equipment or component. For instance, the hard alarm is sounded to inform the person in the Central Office of an immediate problem with the component or equipment while essentially at the same time the control algorithm process dynamically adjusts the set point to temporality help remedy the problem. If the problem cannot be remedied by utilizing the control algorithm process, then the component or equipment is shut down to minimize damage to the system.

Figure 5:
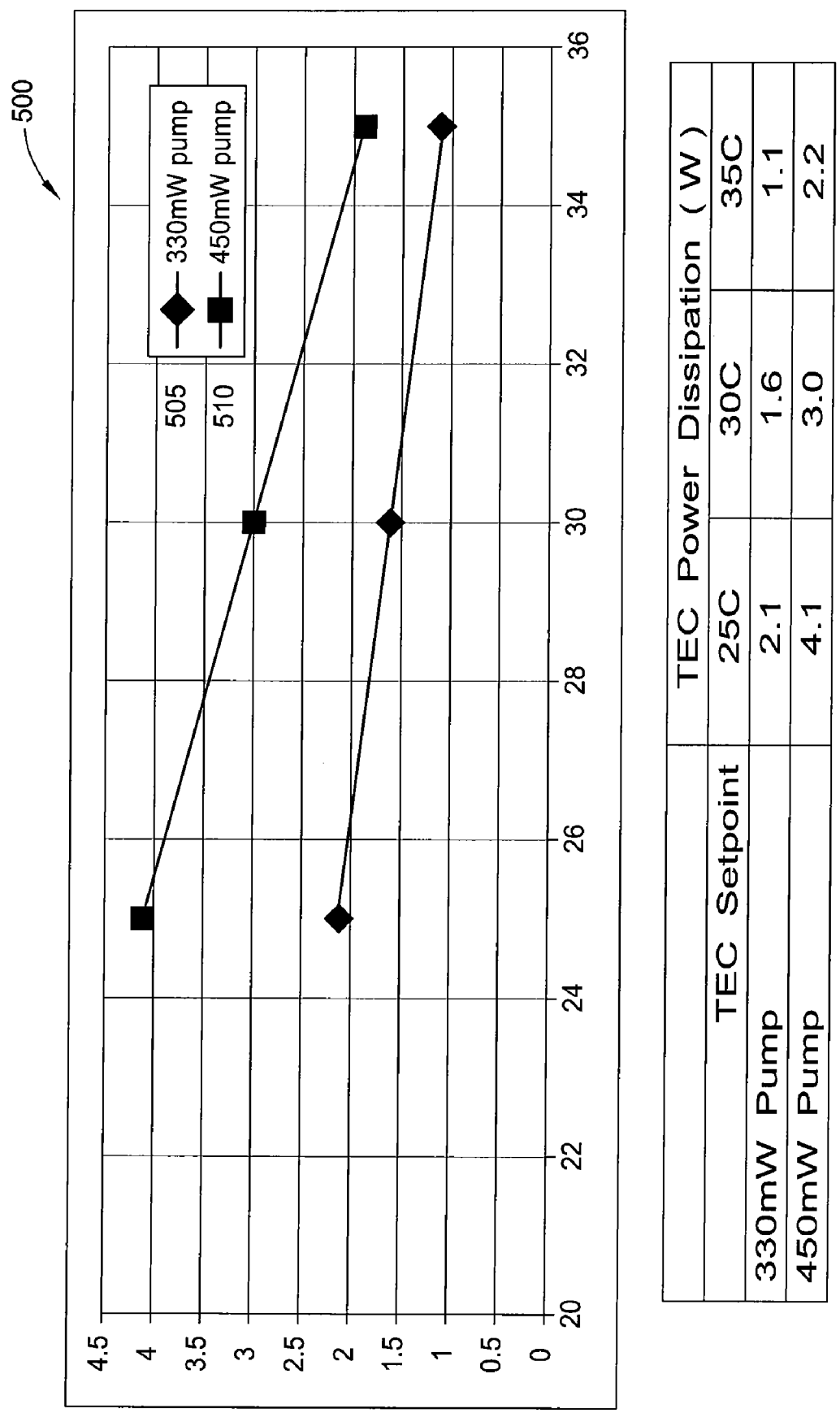
FIG. 5 is a graph illustrating power dissipation relating to dynamically adjusting the set point.

FIG. 5 is a graph 500 illustrating power dissipation relating to dynamically adjusting the set point. The graph 500 includes line 505 that relates to a 330 mW pump and line 510 that relates to a 450 mW pump. As shown in graph 500, the power dissipation decreases as the set point is increased for both the 330 mW pump and the 450 mW pump.

While the foregoing is directed to embodiments of the present invention, other and further embodiments of the invention may be devised without departing from the basic scope thereof, and the scope thereof is determined by the claims that follow.

The invention claimed is:

1. A method for thermally controlling a laser device, the method comprises:
setting a value of a temperature set point in a thermoelectric cooler, wherein the temperature set point corresponds to a first ambient temperature around the laser device that is maintained by the thermoelectric cooler when the laser device is in a first operating state;
monitoring a temperature of the laser device to determine whether the laser device is in the first operating state or a second operating state; and
dynamically altering the value of the temperature set point according to an algorithm upon determination that the laser device is in the second operating state, wherein the altered temperature set point corresponds to a second ambient temperature around the laser device that is maintained by the thermoelectric cooler.

2. The method of claim 1, further including monitoring the temperature to determine if the device returned to the first operating state.

3. The method of claim 1, further including estimating the reliability of the device.

4. The method of claim 1, further including sounding an alarm upon indication of the second operating state.

5. The method of claim 4, wherein the alarm is sounded while substantially at the same time as the dynamic altering of the set point.

6. The method of claim 4, wherein the alarm is a soft alarm if a first condition is met and a hard alarm if the first condition and a second condition are met.

7. The method of claim 6, wherein the first condition relates to a threshold temperature of the device.

8. The method of claim 6, wherein the second condition relates to a threshold power consumption of the device.

9. A method for dynamically controlling a laser device having a thermoelectric cooler, the method comprises:
setting a value of a temperature set point in a thermoelectric cooler that corresponds to a first ambient temperature around the laser device that is maintained by the thermoelectric cooler when the laser device is in a first operating state;
monitoring a power condition in the laser device to determine whether the laser device is in the first operating state or a second operating state;
dynamically adjusting the value of the temperature set point in the thermoelectric cooler according to an algorithm if the laser device is in the second operating state wherein the altered temperature set point corresponds to a second ambient temperature around the laser device that is maintained by the thermoelectric cooler; and
determining whether the laser device has returned to the first operating state by analyzing the power condition.

10. The method of claim 9, further including estimating the reliability of the device.

11. The method of claim 9, further including activating an alarm sequence to determine whether an alarm should be sounded upon indication of the second operating state.

12. The method of claim 11, further including sounding a soft alarm if the condition has reached a threshold temperature.

13. The method of claim 12, wherein the soft alarm is sounded while substantially at the same time as the set point is dynamically adjusted.

14. The method of claim 11, further including sounding a hard alarm if the condition has reached a threshold power level.

15. The method of claim 14, further including shutting down the device after sounding the hard alarm.

16. The method of claim 2, further comprising readjusting the value of the temperature set point as a result of the laser device having returned to the first operating state.

17. The method of claim 9, further comprising readjusting the value of the temperature set point as a result of the laser device having returned to the first operating state.

* * * * *